United States Patent
Wang et al.

(10) Patent No.: US 9,741,751 B2
(45) Date of Patent: Aug. 22, 2017

(54) ARRAY SUBSTRATE FABRICATING METHOD

(71) Applicant: Boe Technology Group Co., Ltd., Beijing (CN)

(72) Inventors: Ke Wang, Beijing (CN); Seongyeol Yoo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/778,257

(22) PCT Filed: Apr. 16, 2015

(86) PCT No.: PCT/CN2015/076706
§ 371 (c)(1),
(2) Date: Sep. 18, 2015

(87) PCT Pub. No.: WO2016/070581
PCT Pub. Date: May 12, 2016

(65) Prior Publication Data
US 2016/0284741 A1    Sep. 29, 2016

(30) Foreign Application Priority Data
Nov. 6, 2014    (CN) .......................... 2014 1 0643661

(51) Int. Cl.
*H01L 27/12*    (2006.01)
*G02F 1/1343*    (2006.01)
(Continued)

(52) U.S. Cl.
CPC ...... *H01L 27/1288* (2013.01); *G02F 1/13439* (2013.01); *G02F 1/136286* (2013.01);
(Continued)

(58) Field of Classification Search
CPC .................................................. H01L 27/1288
See application file for complete search history.

(56) References Cited

U.S. PATENT DOCUMENTS 4,904,611 A * 2/1990 Chiang ............... H01L 21/2022
148/DIG. 132
7,659,578 B2 * 2/2010 Kang ...................... H01L 27/12
257/296
(Continued)

FOREIGN PATENT DOCUMENTS

CN    1716059     1/2006
CN    103378164   10/2013
(Continued)

OTHER PUBLICATIONS

International Search Report and Written Opinion from PCT/CN15/76706 dated Jul. 23, 2015.
(Continued)

*Primary Examiner* — Scott B Geyer
*Assistant Examiner* — S. M. S Imtiaz
(74) *Attorney, Agent, or Firm* — Calfee, Halter & Griswold LLP

(57) ABSTRACT

The present invention provides an array substrate fabricating method. The array substrate fabricating method comprises the steps of: forming a semiconductor material layer and a first photoresist layer on a substrate successively, forming a pattern of an active layer comprising thin film transistors by using the semiconductor material layer and the first photoresist layer through photoetching technology, and reserving the first photoresist layer at least on conductive areas of the active layer when the thin film transistors are turned on; and forming a first material layer on the substrate on which the active layer is formed and the first photoresist layer is reserved on the active layer, and forming a pattern comprising first structures by using the first material layer through (Continued)

the photoetching technology. The method is adapted for fabricating an array substrate using metal oxide thin film transistors.

20 Claims, 4 Drawing Sheets

(51) Int. Cl.
G02F 1/1362 (2006.01)
H01L 29/786 (2006.01)
G02F 1/1368 (2006.01)

(52) U.S. Cl.
CPC .......... *H01L 27/124* (2013.01); *H01L 27/127* (2013.01); *H01L 27/1225* (2013.01); *H01L 29/7869* (2013.01); *G02F 1/1368* (2013.01); *G02F 2001/136295* (2013.01)

(56) References Cited

U.S. PATENT DOCUMENTS

| | | | | |
|---|---|---|---|---|
| 8,053,779 | B2* | 11/2011 | Jun | H01L 27/1255 257/202 |
| 8,624,246 | B2* | 1/2014 | You | H01L 27/1288 257/40 |
| 9,349,752 | B2* | 5/2016 | Yamazaki | H01L 29/7869 |
| 2005/0285197 | A1* | 12/2005 | Park | H01L 29/4908 257/347 |
| 2005/0287719 | A1 | 12/2005 | Ryu et al. | |
| 2012/0184060 | A1* | 7/2012 | Song | H01L 27/1214 438/34 |
| 2013/0221357 | A1* | 8/2013 | Zhang | H01L 29/66477 257/59 |
| 2013/0228772 | A1* | 9/2013 | Choi | H01L 27/1225 257/43 |
| 2015/0115258 | A1* | 4/2015 | Beak | H01L 27/1225 257/43 |
| 2015/0221753 | A1* | 8/2015 | Wang | H01L 29/24 438/104 |

FOREIGN PATENT DOCUMENTS

| | | |
|---|---|---|
| CN | 103545378 | 1/2014 |
| CN | 103915379 | 7/2014 |
| CN | 104091809 | 10/2014 |
| CN | 104409413 | 3/2015 |

OTHER PUBLICATIONS

Office Action from China Application No. 201410643661.6 dated Oct. 9, 2016.
Office Action from China Application No. 201410643661.6 dated Apr. 24, 2017.

\* cited by examiner

ARRAY SUBSTRATE FABRICATING METHOD

RELATED APPLICATIONS

The present application is the U.S. national phase entry of PCT/CN2015/076706, with an international filing date of Apr. 16, 2015, which claims the benefit of Chinese Patent Application No. 201410643661.6 filed Nov. 6, 2014, the entire disclosures of which are incorporated herein by reference.

FIELD OF THE INVENTION

The present invention belongs to the field of liquid crystal display technology, particularly relates to an array substrate fabricating method.

BACKGROUND OF THE INVENTION

The array substrate is an importance component of the liquid crystal display device, and comprises a plurality of thin film transistors (TFTs). The active layer of the conventional thin film transistor is made of materials such as polysilicon, amorphous silicon etc. Compared with the active layer of silicon material, the metal oxide semiconductor (e.g., Indium gallium zinc oxide (IGZO) or Indium tin zinc oxide (ITZO)) has advantages of high mobility, good uniformity, transparency etc. Hence, the metal oxide semiconductor has been used more and more widely as the thin film transistor (metal oxide thin film transistor) of the active layer.

However, since the etching property of the metal oxide is similar as the metal serving as the source and the drain, the Indium tin oxide (ITO) serving as the pixel electrode, it might be damaged in the fabricating process of the source and the drain, as well as the pixel electrode. Therefore, it needs to form an etch stop layer (ESL) made of silicon nitride, silicon oxide, etc. on the active layer (at least on a conductive area in the active layer when the thin film transistor is turned on), so as to prevent the active layer from being damaged in the subsequent process. An additional patterning step is required for forming the etch stop layer, this results in increase of fabricating steps of the array substrate using the metal oxide thin film transistor, and the processes become complex (generally 6 to 7 masks are required).

SUMMARY OF THE INVENTION

In order to solve the problem of complex array substrate fabricating processes of the liquid crystal display device in the prior art, the present invention provides an array substrate fabricating method with simple processes.

According to an embodiment of the present invention, an array substrate fabricating method is provided, comprising: step S1, forming a semiconductor material layer and a first photoresist layer on a substrate successively, forming a pattern of an active layer comprising thin film transistors by using the semiconductor material layer and the first photoresist layer through photoetching technology, and reserving the first photoresist layer at least on conductive areas of the active layer when the thin film transistors are turned on; and step S2, forming a first material layer on the substrate on which the active layer is formed and the first photoresist layer is reserved on the active layer, and forming a pattern comprising first structures by using the first material layer through the photoetching technology.

In the present invention, the "patterning process" refers to the step of forming the required pattern by removing a part of the material layer and reserving another part of the material layer, it includes one or more of the steps of "forming a material layer, coating photoresist, exposing, developing, etching, photoresist stripping".

In the present invention, the "photoetching technology" refers to the step of forming the required pattern by reserving the material layer through the steps of "exposing, developing, etching" after forming the material layer and coating the photoresist. However, it does not include the steps of coating the photoresist and stripping the photoresist".

In the array substrate fabricating method of an embodiment of the present invention, part of the first photoresist layer is reserved in the step of forming the active layer, the reserved first photoresist layer can play the function of protecting the active layer in the subsequent steps, or play the similar function of the etch stop layer. Meanwhile, the reserved first photoresist layer is formed in the conventional patterning process, as long as it is not stripped temporarily in the embodiment of the present invention. So, the fabricating method of the embodiment of the present invention does not need to add additional step of patterning process, moreover, the step of forming the etch stop layer is reduced, which can simplify the array substrate fabricating method.

The semiconductor material layer is a metal oxide semiconductor material layer.

In some embodiments, the first material layer is a transparent conductive material layer, the first structures are pixel electrodes or common electrodes.

Prior to the step S1, the method further comprises: forming a pattern comprising sources and drains on the substrate through a patterning process, the first photoresist layer reserved in the step S1 overlaps with the active layer.

Prior to the step of forming a pattern comprising sources and drains through a patterning process, the method further comprises: forming a pattern comprising gates and gate lines on the substrate through the patterning process; and forming a gate insulating layer on the substrate on which the preceding steps are accomplished.

The step S2 comprises: step S21, forming a transparent conductive material layer and a second photoresist layer successively on the substrate on which the preceding steps are accomplished; step S22, forming a pattern comprising pixel electrodes or common electrodes by using the transparent conductive material layer through the photoetching technology; and step S23, stripping the first photoresist layer and the second photoresist layer.

In some other embodiments, the first material layer is a metal layer, the first structures are sources and drains.

The first photoresist layer reserved in the step Si is located on conductive areas of the active layer when the thin film transistors are turned on, the first photoresist layer is not reserved on the areas of the active layer in contact with the sources and the drains.

The step S1 comprises: step S11, forming a semiconductor material layer and a first photoresist layer on a substrate successively; step S12, exposing and developing the first photoresist layer through gradient exposure process, such that the first photoresist layer of a first thickness is reserved at positions corresponding to the areas of the active layer in contact with the sources and the drains, the first photoresist layer of a second thickness is reserved at positions corresponding to the conductive areas of the active layer when the thin film transistors are turned on, and the first photoresist layer is not reserved at other positions, the first thickness is less than the second thickness; and step S13, removing the semiconductor material layer not covered by the first photoresist layer, so as to form a pattern comprising the active layer, and thinning the reserved first photoresist layer, such that the first thickness is removed, the first photoresist layer of the second thickness is thinned, and reserving the first photoresist layer on the conductive areas of the active layer when the thin film transistors are turned on.

The step S2 comprises: step S21, forming a metal layer and a second photoresist layer successively on the substrate on which the preceding steps are accomplished; step S22, forming a pattern comprising sources and drains by using the metal layer through the photoetching technology; and step S23, removing the second photoresist layer and the first photoresist layer.

Prior to the step S1, the method further comprises: forming a pattern comprising gates and gate lines on the substrate through the patterning process; and forming a gate insulating layer on the substrate on which the preceding steps are accomplished.

The method of the embodiment of the present invention is adapted for fabricating an array substrate using metal oxide thin film transistors.

DETAILED DESCRIPTION OF THE INVENTION

Figure 1:
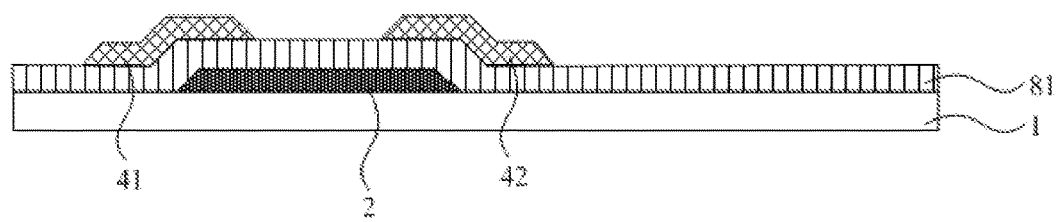
FIG. 1 is a schematic view of a sectional structure after forming sources and drains in an array substrate fabricating method of the embodiment of the present invention.

In order to enable the skilled person in the art to understand the technical solution of the present invention better, the present invention will be described in more details next with reference to the drawings and the embodiments.

According to an embodiment of the present invention, an array substrate fabricating method is provided, comprising: step S101, forming a semiconductor material layer and a first photoresist layer on a substrate successively, forming a pattern of an active layer comprising thin film transistors by using the semiconductor material layer and the first photoresist layer through photoetching technology, and reserving the first photoresist layer at least on conductive areas of the active layer when the thin film transistors are turned on; and step S102, forming a first material layer on the substrate on which the active layer is formed and the first photoresist layer is reserved on the active layer, and forming a pattern comprising first structures by using the first material layer through the photoetching technology.

In the array substrate fabricating method of the embodiment of the present invention, part of the first photoresist layer is reserved in the step of forming the active layer, the reserved first photoresist layer can play the function of protecting the active layer in the subsequent steps, or play the similar function of the etch stop layer. Meanwhile, the reserved first photoresist layer will also be formed in the conventional patterning process, as long as it is not stripped temporarily in the embodiment of the present invention. So the fabricating method of the embodiment of the present invention does not need to add additional step of patterning process (actually a photoresist stripping step is even reduced), moreover, the step of forming the etch stop layer is reduced (the step of forming the etch stop layer), which can simplify the array substrate fabricating method.

According to an embodiment of the present invention, FIG. 1 to FIG. 6 show the fabricating method of the array substrate (i.e., an array substrate of a liquid crystal display device), wherein the first material layer is a transparent conductive material layer 51, the first structure is a pixel electrode 5 or a common electrode 6. In this embodiment, it is described mainly by taking the example that the first structure is the pixel electrode 5.

Specifically, the array substrate fabricating method of this embodiment comprises the following steps of step S201 to step S211.

In step S201, a pattern comprising gates 2 and gate lines (not shown in the figure) is formed on a substrate 1 through the patterning process.

That is to say, the array substrate to be fabricated by the method of this embodiment is a bottom gate structure, consequently, the gates 2 and the gate lines need to be formed firstly. At the same time of forming the gates 2 and the gate lines, common electrode lines (not shown in the figure) may also be formed.

In this step, the gates 2 and the gate lines can be formed through sputtering process, the thickness thereof is ranged from 200 nm to 300 nm, It can be made of metals such as molybdenum, niobium, aluminum, tungsten or alloys thereof. Alternatively, the main body is made of copper, and buffer layers (the thickness is ranged from 20 nm to 30 nm) of molybdenum niobium alloy, molybdenum titanium alloy, molybdenum tungsten alloy are provided at one or two sides of the copper layer, so as to form a double or three layer structure.

Prior to this step, the method may further comprise the step of forming other conventional structures such as buffer layers. If the array substrate to be fabricated by the method of this embodiment is a top gate structure, this step can be performed later.

In step S202, a gate insulating layer (GI) 81 is formed on the substrate 1 on which the preceding steps are accomplished.

In this step, the gate insulating layer 81 can be formed through plasma enhanced chemical vapor deposition (PECVD) process. Its thickness is ranged from 150 nm to 300 nm. It can be made of materials such as silicon oxide, silicon nitrogen, silicon oxynitride, moreover, it can be a single layer structure and can also be a multi-layer structure. In the case of a multi-layer structure, for example, the uppermost structure (i.e., the layer in contact with the active layer) may be silicon dioxide, since the content of hydrogen in the silicon dioxide is relatively small, the performance of the active layer can be improved.

In step S203, a pattern comprising sources 41 and drains 42 is formed through patterning process on the substrate 1 on which the preceding steps are accomplished, so as to obtain the structure as shown in FIG. 1.

In this step, the sources 41 and the drains 42 may be formed by metals, their thickness is ranged from 200 nm to 300 nm, and may be a single layer or multi-layer structure of metals or alloys of copper, molybdenum, niobium, aluminum, tungsten similar as the above gates 2. In this step, other known structures such as data lines can also be formed simultaneously.

Figure 2:
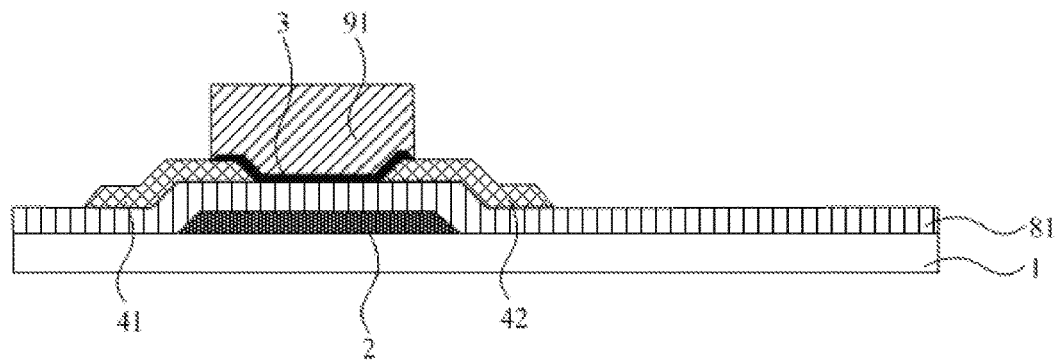
FIG. 2 is a schematic view of a sectional structure after forming an active layer in an array substrate fabricating method of the embodiment of the present invention.

In step S204, a semiconductor material layer and a first photoresist layer 91 are formed successively on the substrate 1 on which the preceding steps are accomplished. A pattern comprising an active layer 3 (in contact with the sources 41 and the drains 42) is formed through photoetching technology, and the photoretched first photoresist layer 91 is reserved. The reserved first photoresist layer 91 overlaps with the active layer 3, so as to obtain the structure as shown in FIG. 2.

For example, the active layer 3 can be formed according to the conventional photoetching technology. After the active layer 3 is formed, the first photoresist layer 91 on the active layer is not stripped, instead, the subsequent steps are performed in the case of reserving the first photoresist layer 91.

In this step, the semiconductor material layer can be formed through sputtering process, the thickness is ranged from 40 nm to 50 nm.

The semiconductor material layer may be a metal oxide semiconductor material, e.g., IGZO or ITZO, i.e., the thin film transistors on this array substrate are metal oxide thin film transistors. Since the metal oxide semiconductor may be easily damaged in the subsequent steps, the method of this embodiment is particularly adapted for the active layer of metal oxide semiconductor. For silicon active layers, the method of this embodiment can also be used.

In step S205, a transparent conductive material layer 51 and a second photoresist layer 92 are formed successively on the substrate 1 on which the preceding steps are accomplished.

Figure 3:
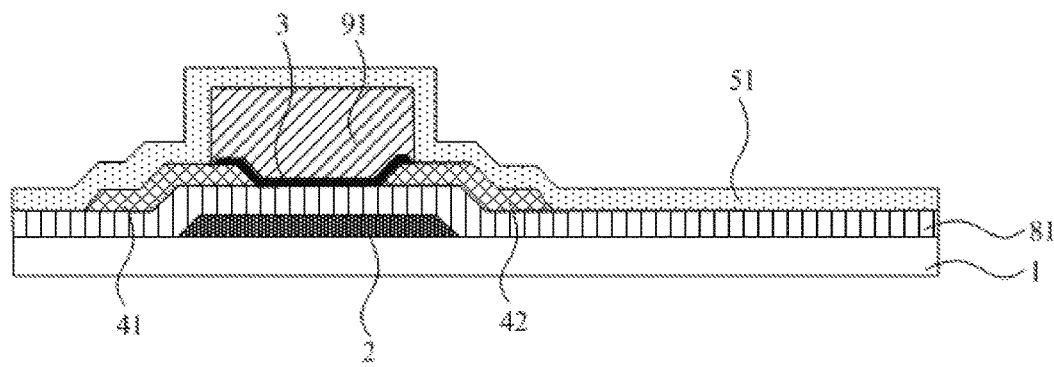
FIG. 3 a schematic view of a sectional structure after forming a transparent conductive material layer in an array substrate fabricating method of the embodiment of the present invention.

For example, the transparent conductive material layer 51 (the thickness is ranged from 30 nm to 50 nm) of indium tin oxide serving as the pixel electrode 5 can be formed through the sputtering process. Since the first photoresist layer 91 is reserved on the active layer 3 here, the transparent conductive material layer 51 and the active layer 3 are separated by the first photoresist layer 91, and do not contact with each other, so as to obtain the structure as shown in FIG. 3. Thereafter, the second photoresist layer 92 is coated sequentially.

Figure 4:
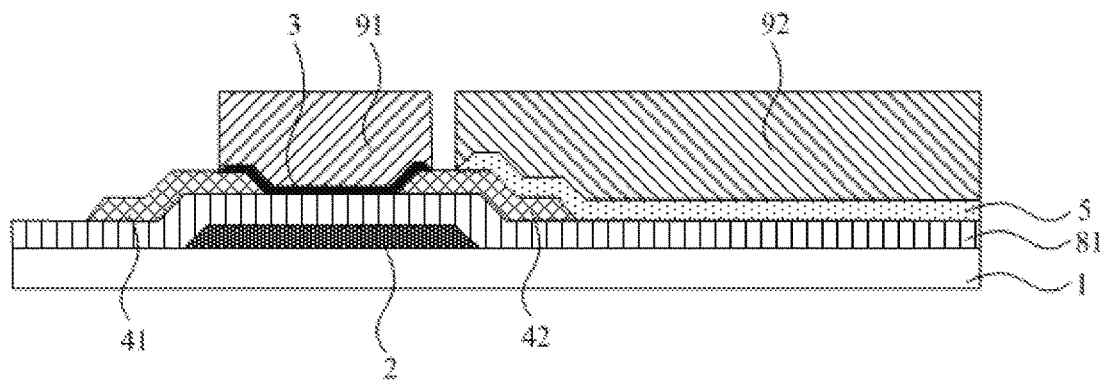
FIG. 4 is a schematic view of a sectional structure after forming pixel electrodes in an array substrate fabricating method of the embodiment of the present invention.

In step S206, a pattern comprising pixel electrodes 5 is formed by using the transparent conductive material layer 51 through the photoetching technology, to obtain the structure as shown in FIG. 4.

For example, the second photoresist layer 92 can be exposed and developed according to the conventional process, then wet etching is performed to the exposed transparent conductive material layer 51, to form pixel electrodes 5 in contact with the drains 42, moreover, the transparent conductive material layer 51 on the reserved first photoresist layer 91 is removed, so the first photoresist layer 91 is exposed, so as to obtain the structure as shown in FIG. 4.

In step S205 and step S206, the reserved first photoresist layer 91 covers the active layer 3 all along, and plays the function of protecting the active layer 3. The reserved first photoresist layer 91 is reserved in the process of forming the active layer 3, it can be obtained as long as the photoresist is not stripped, while not have to add a new patterning step, thereby simplifying the fabricating process of the array substrate.

In this step, the pixel electrodes 5 are formed by using the transparent conductive material layer 51. Alternatively, what are formed in this step may also be common electrodes 6, which differ from the pixel electrodes 5 in that the common electrodes 6 are not in contact with the drains 42, instead, they are in contact with the common electrode lines (which can be formed simultaneously with the gates 2) through via holes in the gate insulating layer 81. Anyhow, no matter what are formed here are pixel electrodes 5 or common electrodes 6, the difference only lies in the specific pattern of the electrodes, while the function of the reserved first photoresist layer 91 is the same.

Figure 5:
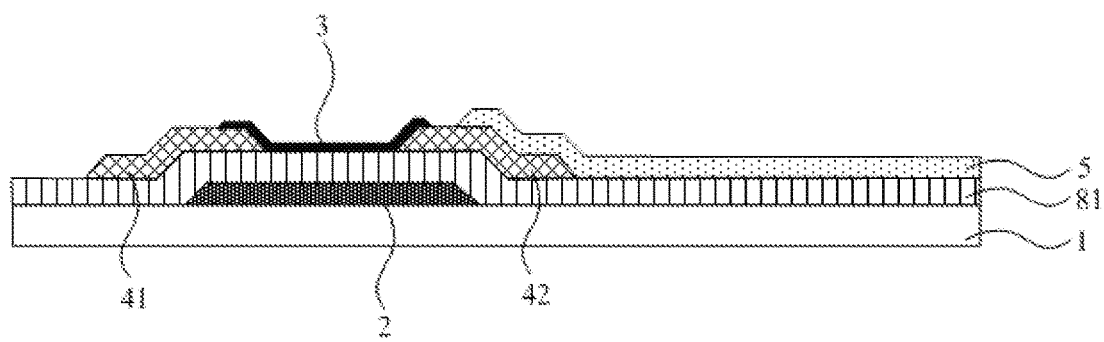
FIG. 5 is a schematic view of a sectional structure after stripping a first photoresist layer and a second photoresist layer in an array substrate fabricating method of the embodiment of the present invention.

In step S207, the remainder first photoresist layer 91 and second photoresist layer 92 are stripped to obtain the structure as shown in FIG. 5.

That is to say, all the photoresist layers are stripped so as to perform the subsequent steps.

In step S208, annealing processing is performed to the substrate 1 on which the preceding steps are accomplished.

The annealing of this step can improve stability of the active layer 3, meanwhile, it can also reduce the square resistance of the pixel electrodes 5, which can be heated for 0.5 to 1.5 hours under the temperature ranged from 200° C. to 300° C.

In step S209, a passivation layer (PVX) 82 is formed on the substrate 1 on which the preceding steps are accomplished, then the annealing can be performed again.

The passivation layer 82 may be a single layer or multi-layer structure of silicon oxide, silicon nitrogen, silicon oxynitride etc., and can be formed by chemical vaporous deposition method, for protecting the active layer 3 and the pixel electrodes 5 etc., and for separating the pixel electrodes 5 from the common electrodes 6. Meanwhile, via holes for enabling the common electrodes 6 to be connected with the common electrode lines are formed in the passivation layer 82.

In this step, the deposition temperature for forming the passivation layer 82 is controlled below 200° C., so as to avoid damage to the active layer 3 and the pixel electrodes 5 etc.

In order to improve stability of the device, annealing can be performed again after the passivation layer 82 is formed, the annealing temperature thereof may be ranged from 250° C. to 350° C., the annealing time may be ranged from 0.5 to 1.5 hours.

Figure 6:
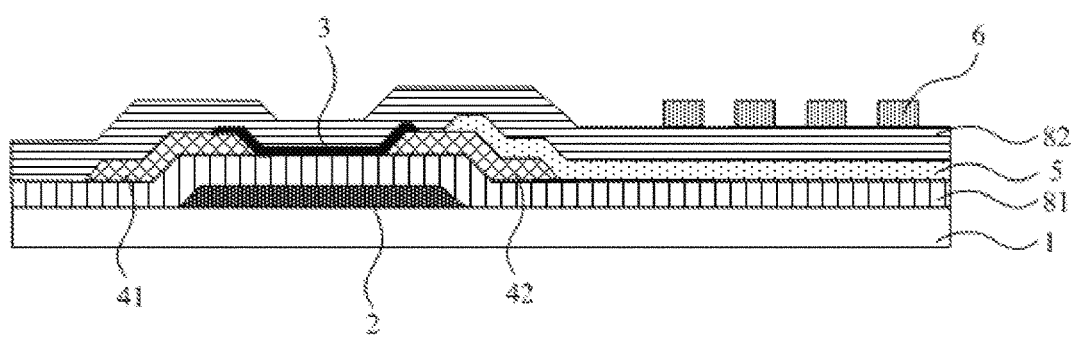
FIG. 6 is a schematic view of a sectional structure of an array substrate fabricated by an array substrate fabricating method of the embodiment of the present invention.

In step S210, a pattern comprising the common electrodes 6 is formed through the patterning process, so as to obtain the structure as shown in FIG. 6.

For example, an indium tin oxide layer (the thickness may be ranged from 30 nm to 50 nm) can be formed through the sputtering process, and etching is performed to it so as to form common electrodes 6 in the form of slit electrodes. The common electrodes 6 are connected with the common electrode lines through the via holes arranged in the passivation layer 82 and the gate insulating layer 81.

In this step, take the example of forming the common electrodes 6, because what are formed in step S206 are pixel electrodes 5. If the common electrodes 6 have been formed in step S206, pixel electrodes 5 will be formed in this step, the pixel electrodes 5 can be connected with the drains 42 through the via holes arranged in the passivation layer 82.

In step S211, final annealing is performed to obtain an array substrate of an advanced super dimension switch (ADS) mode.

The final annealing can improve stability of the device and reduce the resistance of the common electrodes 6. The annealing temperature may be ranged from 250° C. to 300° C., the annealing time may be ranged from 0.5 to 1.5 hours.

It should be understood that the form of the array substrate fabricated by this embodiment may also be changed variously. For example, the step of forming the common electrodes may not be performed, i.e., the common electrodes may be formed on the color film substrate, thereby what is fabricated by the method of this embodiment is a twisted nematic (TN) mode array substrate.

According to another embodiment of the present invention, FIG. 7 to FIG. 13 shows an array substrate (i.e., an array substrate of a liquid crystal display device) fabricating method, wherein the first material layer is a metal layer 4, the first structures are sources 41 and drains 42.

Specifically, the array substrate fabricating method of this embodiment comprises the following steps of step S301 to step S315.

In step S301, a pattern comprising gates 2 and gate lines (not shown in the figure) is formed on the substrate 1 through patterning process.

That is to say, the array substrate to be fabricated by the method of this embodiment is a bottom gate structure, consequently, the gates 2 and the gate lines need to be formed firstly. At the same time of forming the gates 2 and the gate lines, a pattern of common electrode lines (not shown in the figure) may also be formed.

In this step, the gates 2 and the gate lines can be formed through sputtering process, the thickness thereof is ranged from 200 nm to 300 nm. It can be made of metals such as molybdenum, niobium, aluminum, tungsten or alloys thereof, and may be a double or three layer structure.

Prior to this step, the method may further comprise the step of forming other conventional structures such as buffer layers. If the array substrate to be fabricated by the method of this embodiment is a top gate structure, this step can be performed later.

In step S302, a gate insulating layer 81 is formed on the substrate 1 on which the preceding steps are accomplished.

In this step, the gate insulating layer 81 can be formed through plasma enhanced chemical vapor deposition (PECVD) process, its thickness is ranged from 150 nm to 300 nm. It can be made of materials such as silicon oxide, silicon nitrogen, silicon oxynitride, moreover, it can be a single layer or multi-layer structure.

In step S303, a semiconductor material layer 31 and a first photoresist layer 91 are formed successively on the substrate 1 on which the preceding steps are accomplished.

Figure 7:
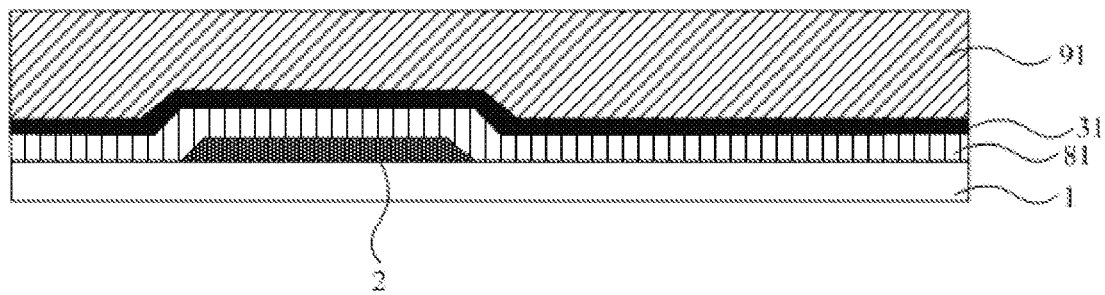
FIG. 7 is a schematic view of a sectional structure after forming a semiconductor material layer in an array substrate fabricating method of the embodiment of the present invention.

In this step, the semiconductor material layer 31 is formed firstly through the sputtering process. The thickness of the semiconductor material layer 31 is ranged from 40 nm to 50 nm. Then the first photoresist layer 91 is coated on the semiconductor material layer 31, to obtain the structure as shown in FIG. 7.

The semiconductor material layer 31 may be a metal oxide semiconductor material, e.g., IGZO or ITZO.

In step S304, the first photoresist layer 91 is exposed and developed through gradient exposure process, such that the first photoresist layer 91 of a first thickness is reserved at positions corresponding to the areas of the active layer 3 in contact with the sources and the drains, the first photoresist layer 91 of a second thickness is reserved at positions corresponding to the conductive areas of the active layer 3 when the thin film transistors are turned on, and the first photoresist layer 91 is not reserved at other positions, the first thickness is less than the second thickness.

Figure 8:
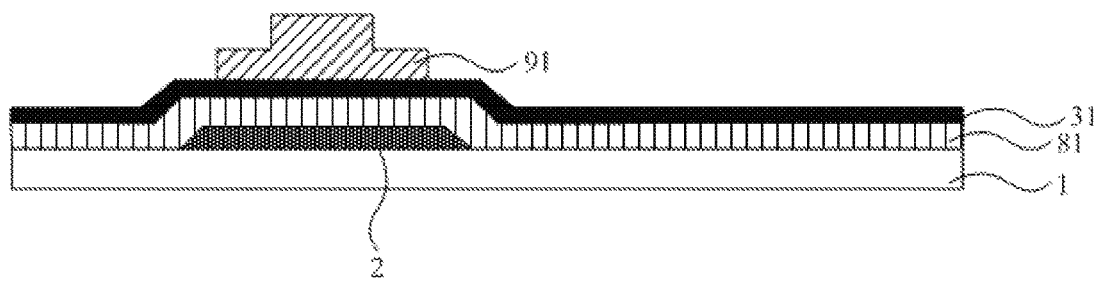
FIG. 8 is a schematic view of a sectional structure after developing the first photoresist layer in an array substrate fabricating method of the embodiment of the present invention.

The "gradient exposure process" refers to performing gradient exposure to the first photoresist layer 91 through a gray scale mask or a half tone mask, such that the exposure degrees of different positions of the first photoresist layer 91 are different. In this way, after development, the first photoresist layer 91 at most positions is removed, while a relatively thin first photoresist layer 91 is reserved at the areas of the active layer 3 in contact with the sources and the drains, a relatively thick first photoresist layer 91 is reserved at the conductive areas (i.e., "trench" areas) in the active layer 3 when the thin film transistors are turned on, so as to obtain the structure as shown in FIG. 8.

Figure 9:
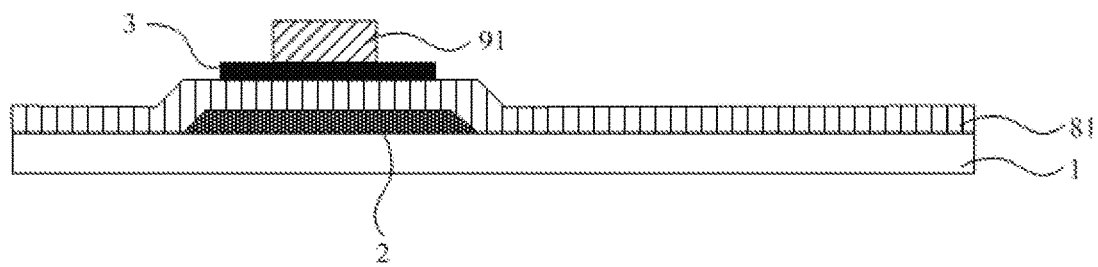
FIG. 9 is a schematic view of a sectional structure after forming an active layer in an array substrate fabricating method of the embodiment of the present invention.

In step S305, the semiconductor material layer 31 not covered by the first photoresist layer 91 is removed to form a pattern comprising the active layer 3, and the reserved first photoresist layer 91 is thinned such that the first photoresistor layer 91 of the first thickness is removed, the first photoresist layer 91 of the second thickness is thinned, so as to obtain the structure as shown in FIG. 9.

For example, the exposed semiconductor material layer 31 can be removed through wet etching, so as to form the active layer 3. Then the reserved first photoresist layer 91 is thinned by ashing, such that the first photoresist layer 91 in the areas of the active layer 3 in contact with the sources and the drains is removed thoroughly, while the first photoresist layer 91 corresponding to the "trench" area is thinned, however, the first photoresist layer 91 of certain thickness (such as the second thickness subtracts the first thickness) is still reserved.

In step S306, plasma processing is performed.

For example, plasma processing can be performed to the substrate 1 by using fluorine containing gas (such as carbon tetrafluoride), thereby improving the performance of the exposed parts (i.e., the parts in contact with the sources and the drains) of the active layer 3, and reducing the ohmic resistance thereof after being in contact with the sources and the drains.

In step S307, the metal layer 4 and the second photoresist layer 92 are formed successively on the substrate 1 on which the preceding steps are accomplished.

Figure 10:
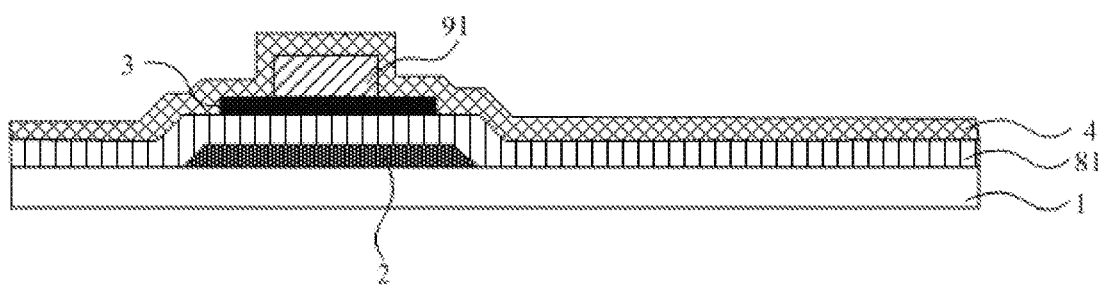
FIG. 10 is a schematic view of a sectional structure after forming a metal layer in an array substrate fabricating method of the embodiment of the present invention.

For example, the metal layer 4 for forming the sources and the drains can be deposited through methods such as sputtering, to obtain the pattern as shown in FIG. 10. The thickness of the metal layer 4 is ranged from 200 nm to 300 nm, and may be a single layer or multi-layer structure of metals or alloys of copper, molybdenum, niobium, aluminum, tungsten similar as the above gates 2. Then, the second photoresist layer 92 is coated on the metal layer 4.

Since there is the first photoresist layer 91 on the "trench" areas of the active layer 3 here, the metal layer 4 is only in contact with the connection areas of the active layer 3 and the sources and the drains, while the metal layer 4 and the "trench" areas are separated by the first photoresist layer 91.

Figure 11:
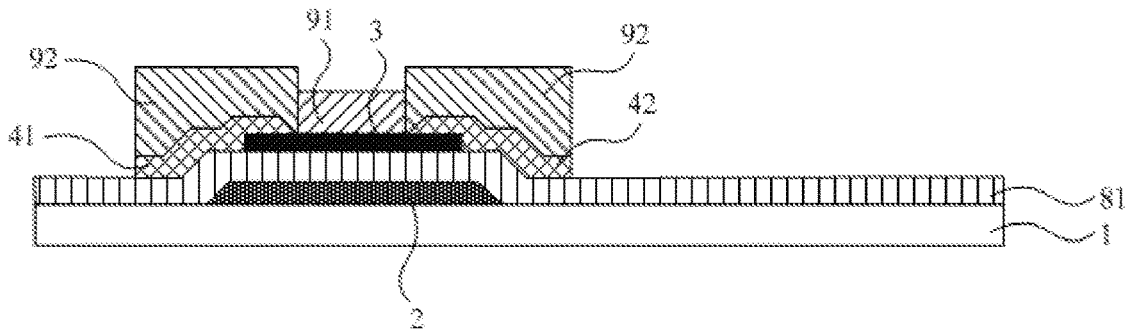
FIG. 11 is a schematic view of a sectional structure after forming sources and drains in an array substrate fabricating method of the embodiment of the present invention.

In step S308, a pattern comprising sources 41 and drains 42 is formed by using the metal layer 4 through the photoetching technology, to obtain the structure as shown in FIG. 11.

For example, the second photoresist layer 92 can be exposed and developed successively, then the exposed metal layer 4 is etched to form sources 41 and drains 42 (data lines can also be formed simultaneously). The sources 41 and the drains 42 are in contact with the areas at the two ends of the active layer 3.

In step S307 and step S308, the reserved first photoresist layer 91 covers the "trench" areas of the active layer 3 all along, which plays the function of protecting the "trench" areas of the active layer 3. The reserved first photoresist layer 91 is reserved in the process of forming the active layer 3, it can be obtained as long as the photoresist is not stripped, while not have to add a new patterning step, thereby simplifying the fabricating process of the array substrate.

Figure 12:
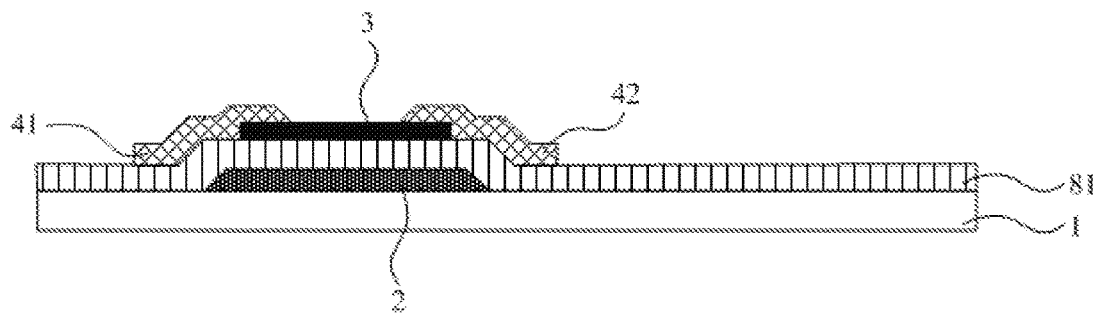
FIG. 12 is a schematic view of a sectional structure after stripping a first photoresist layer and a second photoresist layer in an array substrate fabricating method of the embodiment of the present invention.

In step S309, the remainder second photoresist layer 92 and first photoresist layer 91 are removed to obtain the structure as shown in FIG. 12.

In this step, the first photoresist layer 91 and the second photoresist layer 92 are both removed so as to perform the subsequent steps. The specific process of removing the photoresist may be performing dry etching firstly using oxygen plasma, then performing wet etching so as to remove the remainder photoresist layers thoroughly. Two etchings are used because the remainder first photoresistor 91 here via the high temperature in the step of forming the metal layer 4 is relatively difficult to be removed. As long as the remainder second photoresist layer 92 and first photoresist layer 91 are removed completely, other methods may also be used.

In step S310, a first passivation layer 83 is formed on the substrate 1 on which the preceding steps are accomplished, then annealing processing can be performed to the substrate 1.

The first passivation layer 83 may be a single layer or multi-layer structure of silicon oxide, silicon nitrogen, silicon oxynitride etc., and can be formed by chemical vaporous deposition method, for protecting the active layer 3 etc. There are via holes formed in the first passivation layer 83, e.g., via holes for connecting the pixel electrodes 5 and the drains 42, via holes for connecting the common electrodes 6 and the common electrode lines (which can be formed simultaneously with gates 2).

The deposition temperature of the first passivation layer 83 formed in this step can be controller below 200° C., so as to avoid damage to the active layer.

In order to improve stability of the device, after the first passivation layer 83 is formed, annealing can be further performed, specifically it can be heated for 0.5 to 1.5 hours under the temperature ranged from 250° C. to 350° C.

In step S311, a planar layer 89 is formed on the substrate 1 on which the preceding steps are accomplished.

The planar layer 89 can be formed by resin materials through steps of exposing, drying (the drying temperature is ranged from 220° C. to 250° C.). Then dry etching can be further performed so as to form via holes in the planar layer 89 and the first passivation layer 83, e.g., via holes for connecting the pixel electrodes 5 and the drains 42, and via holes for connecting the common electrodes 6 and the common electrode lines.

In step S312, a pattern comprising the pixel electrodes 5 is formed through the patterning process.

Pixel electrodes 5 with a thickness ranged from 30 nm to 50 nm are formed using transparent conductive materials such as tin indium oxide. The pixel electrodes 5 may be in a plate shape, and connected with the drains 42 through the via holes in the planar layer 89 and the first passivation layer 83.

In step S313, a second passivation layer 84 is formed on the substrate 1 on which the preceding steps are accomplished.

The second passivation layer 84 can be made of silicon oxide, silicon nitrogen, silicon oxynitride etc. Via holes for connecting the common electrodes 6 and the common electrode lines are formed in the second passivation layer 84.

The deposition temperature of the second passivation layer 84 does not exceed the drying temperature of the planar layer 89.

Figure 13:
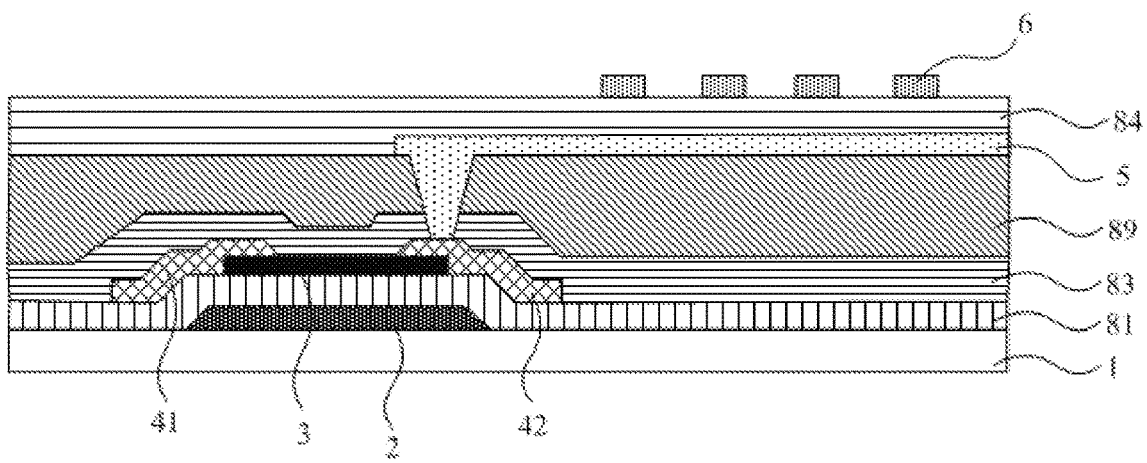
FIG. 13 is a schematic view of a sectional structure of an array substrate fabricated by an array substrate fabricating method of the embodiment of the present invention.

In step S314, a pattern comprising the common electrodes 6 is formed through the patterning process, as shown in FIG. 13.

Common electrodes 6 with a thickness ranged from 30 nm to 50 nm are formed using transparent conductive materials such as tin indium oxide. The common electrodes 6 may be slit electrodes and connected with the common electrode lines through the via holes arranged in the second passivation layer 84, the planar layer 89, and the first passivation layer 83.

In step S315, the final annealing processing is performed to obtain an array substrate of an advanced super dimension switch (ADS) mode.

The final annealing can improve stability of the device and reduce the resistance of the common electrodes 6. The annealing temperature does not exceed the drying temperature of the planar layer 89, generally being ranged from 200° C. to 250° C.

It should be understood that the specific method of this embodiment may be various. For example, the pixel electrodes can be formed firstly and then the common electrodes are formed. Alternatively, the common electrodes can be formed firstly and then the pixel electrodes are formed (the via hole positions are different correspondingly). Alternatively, the pixel electrodes can be formed only, i.e., the array substrate to be fabricated by the method of this embodiment can also be a twisted nematic (TN) mode array substrate.

It can be understood that the above embodiments are only exemplary embodiments used for explaining the principle of the present invention, however, the present invention is not limited to this. The ordinary skilled person in the art, in the case of not departing from the spirit and essence of the present invention, can make various modifications and improvements, these modifications and improvements are also regarded as the protection scopes of the present invention.

What is claimed is:

1. An array substrate fabricating method, comprising:
   step S1, forming a semiconductor material layer and a first photoresist layer on a substrate successively, forming a pattern of an active layer comprising thin film transistors by using the semiconductor material layer and the first photoresist layer through photoetching technology, and reserving the first photoresist layer at least on conductive areas of the active layer when the thin film transistors are turned on; and
   step S2, forming a first material layer on the substrate on which the active layer is formed and the first photoresist layer is reserved on the active layer, and forming a pattern comprising first structures by using the first material layer through the photoetching technology.

2. The array substrate fabricating method according to claim 1, wherein
   the first material layer is a transparent conductive material layer;
   the first structures are pixel electrodes or common electrodes.

3. The array substrate fabricating method according to claim 2, wherein
   prior to the step S1, the method further comprises: forming a pattern comprising sources and drains on the substrate through a patterning process,
   the first photoresist layer reserved in the step S1 overlaps with the active layer.

4. The array substrate fabricating method according to claim 3, wherein prior to the step of forming a pattern comprising sources and drains through a patterning process, the method further comprises:
   forming a pattern comprising gates and gate lines on the substrate through the patterning process; and
   forming a gate insulating layer on the substrate on which the preceding steps are accomplished.

5. The array substrate fabricating method according to claim 2, wherein the step S2 comprises:
   step S21, forming a transparent conductive material layer and a second photoresist layer successively on the substrate on which the preceding steps are accomplished;
   step S22, forming a pattern comprising pixel electrodes or common electrodes by using the transparent conductive material layer through the photoetching technology; and
   step S23, stripping the first photoresist layer and the second photoresist layer.

6. The array substrate fabricating method according to claim 1, wherein
   the first material layer is a metal layer;
   the first structures are sources and drains.

7. The array substrate fabricating method according to claim 6, wherein the first photoresist layer reserved in the step S1 is located on conductive areas of the active layer when the thin film transistors are turned on, the first photoresist layer is not reserved on the areas of the active layer in contact with the sources and the drains.

8. The array substrate fabricating method according to claim 7, wherein the step S1 comprises:
   step S11, forming a semiconductor material layer and a first photoresist layer on a substrate successively;
   step S12, exposing and developing the first photoresist layer through gradient exposure process, such that the first photoresist layer of a first thickness is reserved at positions corresponding to the areas of the active layer in contact with the sources and the drains, the first photoresist layer of a second thickness is reserved at positions corresponding to the conductive areas of the active layer when the thin film transistors are turned on, and the first photoresist layer is not reserved at other positions, the first thickness is less than the second thickness; and
   step S13, removing the semiconductor material layer not covered by the first photoresist layer, so as to form a pattern comprising the active layer, and thinning the reserved first photoresist layer, such that the first photoresist layer of the first thickness is removed, the first photoresist layer of the second thickness is thinned, and reserving the first photoresist layer on the conductive areas of the active layer when the thin film transistors are turned on.

9. The array substrate fabricating method according to claim 7, wherein the step S2 comprises:
   step S21, forming a metal layer and a second photoresist layer successively on the substrate on which the preceding steps are accomplished;
   step S22, forming a pattern comprising sources and drains by using the metal layer through the photoetching technology; and
   step S23, removing the second photoresist layer and the first photoresist layer.

10. The array substrate fabricating method according to claim 6, wherein prior to the step S1, the method further comprises:
    forming a pattern comprising gates and gate lines on the substrate through the patterning process; and
    forming a gate insulating layer on the substrate on which the preceding steps are accomplished.

11. The array substrate fabricating method according to claim 1, wherein
    the semiconductor material layer is a metal oxide semiconductor material layer.

12. The array substrate fabricating method according to claim 11, wherein
    the first material layer is a transparent conductive material layer;
    the first structures are pixel electrodes or common electrodes.

13. The array substrate fabricating method according to claim 12, wherein
    prior to the step S1, the method further comprises: forming a pattern comprising sources and drains on the substrate through a patterning process,
    the first photoresist layer reserved in the step S1 overlaps with the active layer.

14. The array substrate fabricating method according to claim 13, wherein prior to the step of forming a pattern comprising sources and drains through a patterning process, the method further comprises:
    forming a pattern comprising gates and gate lines on the substrate through the patterning process; and
    forming a gate insulating layer on the substrate on which the preceding steps are accomplished.

15. The array substrate fabricating method according to claim 12, wherein the step S2 comprises:
    step S21, forming a transparent conductive material layer and a second photoresist layer successively on the substrate on which the preceding steps are accomplished;
    step S22, forming a pattern comprising pixel electrodes or common electrodes by using the transparent conductive material layer through the photoetching technology; and step S23, stripping the first photoresist layer and the second photoresist layer.

16. The array substrate fabricating method according to claim 11, wherein the first material layer is a metal layer;

the first structures are sources and drains.

17. The array substrate fabricating method according to claim 16, wherein the first photoresist layer reserved in the step S1 is located on conductive areas of the active layer when the thin film transistors are turned on, the first photoresist layer is not reserved on the areas of the active layer in contact with the sources and the drains.

18. The array substrate fabricating method according to claim 17, wherein the step S1 comprises:

step S11, forming a semiconductor material layer and a first photoresist layer on a substrate successively;

step S12, exposing and developing the first photoresist layer through gradient exposure process, such that the first photoresist layer of a first thickness is reserved at positions corresponding to the areas of the active layer in contact with the sources and the drains, the first photoresist layer of a second thickness is reserved at positions corresponding to the conductive areas of the active layer when the thin film transistors are turned on, and the first photoresist layer is not reserved at other positions, the first thickness is less than the second thickness; and step S13, removing the semiconductor material layer not covered by the first photoresist layer, so as to form a pattern comprising the active layer, and thinning the reserved first photoresist layer, such that the first photoresist layer of the first thickness is removed, the first photoresist layer of the second thickness is thinned, and reserving the first photoresist layer on the conductive areas of the active layer when the thin film transistors are turned on.

19. The array substrate fabricating method according to claim 17, wherein the step S2 comprises:

step S21, forming a metal layer and a second photoresist layer successively on the substrate on which the preceding steps are accomplished;

step S22, forming a pattern comprising sources and drains by using the metal layer through the photoetching technology; and step S23, removing the second photoresist layer and the first photoresist layer.

20. The array substrate fabricating method according to claim 16, wherein prior to the step S1, the method further comprises:

forming a pattern comprising gates and gate lines on the substrate through the patterning process; and forming a gate insulating layer on the substrate on which the preceding steps are accomplished.

* * * * *